(12) United States Patent
Hiatt et al.

(10) Patent No.: US 11,177,175 B2
(45) Date of Patent: Nov. 16, 2021

(54) MICROELECTRONIC DEVICES AND METHODS FOR FILLING VIAS IN MICROELECTRONIC DEVICES

(71) Applicant: Micron Technology, Inc., Boise, ID (US)

(72) Inventors: William M. Hiatt, Eagle, ID (US); Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/055,492

(22) Filed: Aug. 6, 2018

(65) Prior Publication Data
US 2018/0342477 A1  Nov. 29, 2018

Related U.S. Application Data

(60) Continuation of application No. 15/583,500, filed on May 1, 2017, now abandoned, which is a continuation
(Continued)

(51) Int. Cl.
*H01L 21/768* (2006.01)
*H01L 21/683* (2006.01)
(Continued)

(52) U.S. Cl.
CPC .... *H01L 21/76898* (2013.01); *H01L 21/6835* (2013.01); *H01L 23/481* (2013.01);
(Continued)

(58) Field of Classification Search
CPC ............. H01L 21/486; H01L 21/76898; H01L 2225/06541; H01L 24/14; H01L 2924/00; H01L 23/481
See application file for complete search history.

(56) References Cited

U.S. PATENT DOCUMENTS 2,821,959 A   2/1958  Franz
3,006,318 A   10/1961 Monroe, Jr. et al.
(Continued)

FOREIGN PATENT DOCUMENTS

DE   10205026 C1   5/2003
EP   0127946       12/1984
(Continued)

OTHER PUBLICATIONS

Aachboun, S. and P. Ranson, "Cryogenic etching of deep narrow trenches in silicon," J. Vac. Sci. Technol. A 18(4), Jul./Aug. 2000, pp. 1848-1852.
(Continued)

*Primary Examiner* — Lauren R Bell
(74) *Attorney, Agent, or Firm* — Perkins Coie LLP

(57) ABSTRACT

Microelectronic devices and methods for filling vias and forming conductive interconnects in microfeature workpieces and dies are disclosed herein. In one embodiment, a method includes providing a microfeature workpiece having a plurality of dies and at least one passage extending through the microfeature workpiece from a first side of the microfeature workpiece to an opposite second side of the microfeature workpiece. The method can further include forming a conductive plug in the passage adjacent to the first side of the microelectronic workpiece, and depositing conductive material in the passage to at least generally fill the passage from the conductive plug to the second side of the microelectronic workpiece.

21 Claims, 6 Drawing Sheets

Related U.S. Application Data of application No. 14/300,004, filed on Jun. 9, 2014, now Pat. No. 9,653,420, which is a continuation of application No. 13/337,943, filed on Dec. 27, 2011, now Pat. No. 8,748,311, which is a division of application No. 10/733,226, filed on Dec. 10, 2003, now Pat. No. 8,084,866.

(51) Int. Cl.
  *H01L 25/065* (2006.01)
  *H01L 25/00* (2006.01)
  *H01L 23/48* (2006.01)

(52) U.S. Cl.
  CPC .......... *H01L 25/0657* (2013.01); *H01L 25/50* (2013.01); *H01L 2224/32145* (2013.01); *H01L 2224/48145* (2013.01); *H01L 2224/73207* (2013.01); *H01L 2224/73257* (2013.01); *H01L 2225/06506* (2013.01); *H01L 2225/06513* (2013.01); *H01L 2225/06541* (2013.01); *H01L 2924/00014* (2013.01); *H01L 2924/01046* (2013.01); *H01L 2924/01078* (2013.01); *H01L 2924/01079* (2013.01); *H01L 2924/12042* (2013.01); *H01L 2924/14* (2013.01)

(56) References Cited

U.S. PATENT DOCUMENTS

| | | |
|---|---|---|
| 3,345,134 A | 10/1967 | Heymer et al. |
| 3,865,298 A | 2/1975 | Allen et al. |
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,700,473 A | 10/1987 | Freyman et al. |
| 4,756,765 A | 7/1988 | Woodroffe |
| 4,768,291 A | 9/1988 | Palmer |
| 4,818,728 A | 4/1989 | Rai et al. |
| 4,907,127 A | 3/1990 | Lee |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers |
| 5,027,184 A | 6/1991 | Soclof |
| 5,037,782 A | 8/1991 | Nakamura et al. |
| 5,107,328 A | 4/1992 | Kinsman |
| 5,123,902 A | 6/1992 | Stiftung |
| 5,128,831 A | 7/1992 | Fox, III et al. |
| 5,138,434 A | 8/1992 | Wood et al. |
| 5,145,099 A | 9/1992 | Wood et al. |
| 5,158,911 A | 10/1992 | Quentin |
| 5,219,344 A | 6/1993 | Yoder |
| 5,233,448 A | 8/1993 | Wu |
| 5,237,148 A | 8/1993 | Aoki et al. |
| 5,252,857 A | 10/1993 | Kane et al. |
| 5,289,631 A | 3/1994 | Koopman et al. |
| 5,292,686 A | 3/1994 | Riley et al. |
| 5,294,568 A | 3/1994 | McNeilly et al. |
| 5,304,743 A | 4/1994 | Sen et al. |
| 5,378,312 A | 1/1995 | Gifford et al. |
| 5,378,313 A | 1/1995 | Pace |
| 5,380,681 A | 1/1995 | Hsu |
| 5,402,435 A | 3/1995 | Shiono et al. |
| 5,406,630 A | 4/1995 | Piosenka et al. |
| 5,424,573 A | 6/1995 | Kato et al. |
| 5,438,212 A | 8/1995 | Okaniwa |
| 5,447,871 A | 9/1995 | Goldstein |
| 5,464,960 A | 11/1995 | Hall et al. |
| 5,481,483 A | 1/1996 | Ebenstein |
| 5,496,755 A | 3/1996 | Bayraktaroglu |
| 5,515,167 A | 5/1996 | Ledger et al. |
| 5,518,956 A | 5/1996 | Liu et al. |
| 5,518,957 A | 5/1996 | Kim |
| 5,585,308 A | 12/1996 | Sardella |
| 5,585,675 A | 12/1996 | Knopf |
| 5,593,927 A | 1/1997 | Farnworth et al. |
| 5,614,743 A | 3/1997 | Mochizuki |
| 5,618,752 A | 4/1997 | Gaul |
| 5,624,437 A | 4/1997 | Freeman et al. |
| 5,627,106 A | 5/1997 | Hsu |
| 5,646,067 A | 7/1997 | Gaul |
| 5,654,221 A | 8/1997 | Cronin et al. |
| 5,673,846 A | 10/1997 | Gruber |
| 5,677,566 A | 10/1997 | King et al. |
| 5,684,642 A | 11/1997 | Zumoto et al. |
| 5,690,841 A | 11/1997 | Elderstig |
| 5,718,791 A | 2/1998 | Spengler |
| 5,723,904 A | 3/1998 | Shiga |
| 5,726,493 A | 3/1998 | Yamashita et al. |
| 5,767,010 A * | 6/1998 | Mis ............ H01L 21/2885 438/614 |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,883,426 A | 3/1999 | Tokuno et al. |
| 5,891,797 A | 4/1999 | Farrar |
| 5,893,828 A | 4/1999 | Uram |
| 5,904,499 A | 5/1999 | Pace |
| 5,925,930 A | 7/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,969,422 A | 10/1999 | Ting et al. |
| 5,986,209 A | 11/1999 | Tandy |
| 5,990,566 A | 11/1999 | Farnworth et al. |
| 5,998,240 A | 12/1999 | Hamilton et al. |
| 5,998,292 A | 12/1999 | Black et al. |
| 6,004,867 A | 12/1999 | Kim et al. |
| 6,008,070 A | 12/1999 | Farnworth |
| 6,008,914 A | 12/1999 | Sasagawa et al. |
| 6,018,249 A | 1/2000 | Akram et al. |
| 6,020,624 A | 2/2000 | Wood et al. |
| 6,020,629 A | 2/2000 | Farnworth et al. |
| 6,028,365 A | 2/2000 | Akram et al. |
| 6,048,755 A | 4/2000 | Jiang et al. |
| 6,051,878 A | 4/2000 | Akram et al. |
| 6,066,514 A | 5/2000 | King et al. |
| 6,072,233 A | 6/2000 | Corisis et al. |
| 6,072,236 A | 6/2000 | Akram et al. |
| 6,080,291 A | 6/2000 | Woodruff et al. |
| 6,081,429 A | 6/2000 | Barrett |
| 6,089,920 A | 7/2000 | Farnworth et al. |
| 6,097,087 A | 8/2000 | Farnworth et al. |
| 6,103,547 A | 8/2000 | Corisis et al. |
| 6,107,122 A | 8/2000 | Wood et al. |
| 6,107,180 A | 8/2000 | Munroe et al. |
| 6,107,679 A | 8/2000 | Noguchi |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,130,474 A | 10/2000 | Corisis |
| 6,133,622 A | 10/2000 | Corisis et al. |
| 6,137,182 A | 10/2000 | Hause et al. |

(56) References Cited

U.S. PATENT DOCUMENTS

| | | | |
|---|---|---|---|
| 6,140,604 A | 10/2000 | Somers et al. | |
| 6,143,588 A | 11/2000 | Glenn | |
| 6,148,509 A | 11/2000 | Schoenfeld et al. | |
| 6,150,717 A | 11/2000 | Wood et al. | |
| 6,153,924 A | 11/2000 | Kinsman | |
| 6,159,764 A | 12/2000 | Kinsman et al. | |
| 6,175,149 B1 | 1/2001 | Akram | |
| 6,180,518 B1 | 1/2001 | Layadi et al. | |
| 6,184,060 B1 | 2/2001 | Siniaguine | |
| 6,184,465 B1 | 2/2001 | Corisis | |
| 6,187,615 B1 | 2/2001 | Kim et al. | |
| 6,188,232 B1 | 2/2001 | Akram et al. | |
| 6,191,487 B1 | 2/2001 | Rodenbeck et al. | |
| 6,201,304 B1 | 3/2001 | Moden | |
| 6,203,539 B1 | 3/2001 | Shimmick et al. | |
| 6,212,767 B1 | 4/2001 | Tandy | |
| 6,214,716 B1 | 4/2001 | Akram | |
| 6,221,769 B1 | 4/2001 | Dhong et al. | |
| 6,222,136 B1 | 4/2001 | Appelt et al. | |
| 6,222,270 B1 | 4/2001 | Lee | |
| 6,225,689 B1 | 5/2001 | Moden et al. | |
| 6,228,548 B1 | 5/2001 | King et al. | |
| 6,228,687 B1 | 5/2001 | Akram et al. | |
| 6,229,202 B1 | 5/2001 | Corisis | |
| 6,232,666 B1 | 5/2001 | Corisis et al. | |
| 6,235,552 B1 | 5/2001 | Kwon et al. | |
| 6,235,554 B1 | 5/2001 | Akram et al. | |
| 6,239,489 B1 | 5/2001 | Jiang | |
| 6,246,108 B1 | 6/2001 | Corisis et al. | |
| 6,247,629 B1 | 6/2001 | Jacobson et al. | |
| 6,252,300 B1 | 6/2001 | Hsuan et al. | |
| 6,258,623 B1 | 7/2001 | Moden et al. | |
| 6,259,153 B1 | 7/2001 | Corisis | |
| 6,261,865 B1 | 7/2001 | Akram | |
| 6,265,766 B1 | 7/2001 | Moden | |
| 6,268,114 B1 | 7/2001 | Wen et al. | |
| 6,271,580 B1 | 8/2001 | Corisis | |
| 6,277,757 B1 | 8/2001 | Lin | |
| 6,281,042 B1 | 8/2001 | Ahn et al. | |
| 6,281,577 B1 | 8/2001 | Oppermann et al. | |
| 6,285,204 B1 | 9/2001 | Farnworth | |
| 6,291,894 B1 | 9/2001 | Farnworth et al. | |
| 6,294,837 B1 | 9/2001 | Akram et al. | |
| 6,294,839 B1 | 9/2001 | Mess et al. | |
| 6,297,155 B1 | 10/2001 | Simpson et al. | |
| 6,297,547 B1 | 10/2001 | Akram | |
| 6,303,981 B1 | 10/2001 | Moden | |
| 6,310,390 B1 | 10/2001 | Moden | |
| 6,324,253 B1 | 11/2001 | Yuyama et al. | |
| 6,326,689 B1 | 12/2001 | Thomas | |
| 6,326,697 B1 | 12/2001 | Farnworth | |
| 6,326,698 B1 | 12/2001 | Akram | |
| 6,329,222 B1 | 12/2001 | Corisis et al. | |
| 6,329,632 B1 | 12/2001 | Fournier et al. | |
| 6,331,221 B1 | 12/2001 | Cobbley | |
| 6,341,009 B1 | 1/2002 | O'Connor et al. | |
| 6,344,976 B1 | 2/2002 | Schoenfeld et al. | |
| 6,359,254 B1 | 3/2002 | Brown | |
| 6,359,328 B1 | 3/2002 | Dubin | |
| 6,372,548 B2 | 4/2002 | Bessho et al. | |
| 6,383,362 B2 | 5/2002 | Satoh | |
| 6,388,208 B1 | 5/2002 | Kiani et al. | |
| 6,391,770 B2 | 5/2002 | Kosaki et al. | |
| 6,406,636 B1 | 6/2002 | Vaganov | |
| 6,429,528 B1 | 8/2002 | King et al. | |
| 6,432,796 B1 | 8/2002 | Peterson | |
| 6,432,821 B1 | 8/2002 | Dubin et al. | |
| 6,433,303 B1 | 8/2002 | Liu et al. | |
| 6,433,304 B2 | 8/2002 | Okumura et al. | |
| 6,437,284 B1 | 8/2002 | Okamoto et al. | |
| 6,437,441 B1 | 8/2002 | Yamamoto | |
| 6,437,586 B1 | 8/2002 | Robinson | |
| 6,441,487 B2 | 8/2002 | Elenius et al. | |
| 6,452,270 B1 | 9/2002 | Huang | |
| 6,457,515 B1 | 10/2002 | Vafai et al. | |
| 6,459,039 B1 | 10/2002 | Bezama et al. | |
| 6,459,150 B1 | 10/2002 | Wu et al. | |
| 6,468,889 B1 | 10/2002 | Iacoponi et al. | |
| 6,483,044 B1 | 11/2002 | Ahmad | |
| 6,486,083 B1 | 11/2002 | Mizuno et al. | |
| 6,486,549 B1 | 11/2002 | Paek | |
| 6,521,516 B2 | 2/2003 | Monzon et al. | |
| 6,521,530 B2 | 2/2003 | Peters et al. | |
| 6,534,192 B1 | 3/2003 | Abys et al. | |
| 6,534,863 B2 | 3/2003 | Walker et al. | |
| 6,545,563 B1 | 4/2003 | Smith | |
| 6,548,376 B2 | 4/2003 | Jiang | |
| 6,552,910 B1 | 4/2003 | Moon et al. | |
| 6,555,782 B2 | 4/2003 | Isaji et al. | |
| 6,560,047 B2 | 5/2003 | Choi et al. | |
| 6,560,117 B2 | 5/2003 | Moon et al. | |
| 6,564,979 B2 | 5/2003 | Savaria | |
| 6,566,232 B1 * | 5/2003 | Hara | H01L 21/76898 257/E21.597 |
| 6,569,711 B1 | 5/2003 | Susko et al. | |
| 6,569,777 B1 | 5/2003 | Hsu et al. | |
| 6,572,606 B2 | 6/2003 | Kliewer et al. | |
| 6,576,531 B2 | 6/2003 | Peng et al. | |
| 6,580,174 B2 | 6/2003 | McCormick et al. | |
| 6,582,987 B2 | 6/2003 | Jun et al. | |
| 6,582,992 B2 | 6/2003 | Poo et al. | |
| 6,593,644 B2 | 7/2003 | Chiu et al. | |
| 6,599,436 B1 | 7/2003 | Matzke et al. | |
| 6,606,251 B1 | 8/2003 | Kenny, Jr. et al. | |
| 6,607,937 B1 | 8/2003 | Corisis | |
| 6,614,033 B2 | 9/2003 | Suguro et al. | |
| 6,614,092 B2 | 9/2003 | Eldridge et al. | |
| 6,620,031 B2 | 9/2003 | Renteln | |
| 6,620,731 B1 | 9/2003 | Farnworth et al. | |
| 6,621,045 B1 | 9/2003 | Liu et al. | |
| 6,638,410 B2 | 10/2003 | Chen et al. | |
| 6,653,236 B2 | 11/2003 | Wai et al. | |
| 6,658,818 B2 | 12/2003 | Kurth et al. | |
| 6,660,622 B2 | 12/2003 | Chen et al. | |
| 6,660,630 B1 | 12/2003 | Chang et al. | |
| 6,664,129 B2 | 12/2003 | Siniaguine | |
| 6,664,485 B2 | 12/2003 | Bhatt et al. | |
| 6,667,551 B2 | 12/2003 | Hanaoka et al. | |
| 6,680,459 B2 | 1/2004 | Kanaya et al. | |
| 6,699,787 B2 | 3/2004 | Mashino et al. | |
| 6,703,310 B2 | 3/2004 | Mashino et al. | |
| 6,708,405 B2 | 3/2004 | Hasler et al. | |
| 6,746,971 B1 | 6/2004 | Ngo et al. | |
| 6,750,144 B2 | 6/2004 | Taylor | |
| 6,756,564 B2 | 6/2004 | Tian | |
| 6,770,958 B2 | 8/2004 | Wang et al. | |
| 6,774,486 B2 | 8/2004 | Kinsman | |
| 6,777,244 B2 | 8/2004 | Pepper et al. | |
| 6,780,749 B2 | 8/2004 | Masumoto et al. | |
| 6,790,775 B2 | 9/2004 | Fartash | |
| 6,797,616 B2 | 9/2004 | Kinsman | |
| 6,809,025 B2 | 10/2004 | Sandhu et al. | |
| 6,809,421 B1 * | 10/2004 | Hayasaka | H01L 21/76898 257/621 |
| 6,818,464 B2 | 11/2004 | Heschel | |
| 6,825,127 B2 | 11/2004 | Ouellet et al. | |
| 6,825,557 B2 | 11/2004 | DiBattista et al. | |
| 6,828,175 B2 | 12/2004 | Wood et al. | |
| 6,828,223 B2 | 12/2004 | Chuang | |
| 6,838,377 B2 | 1/2005 | Tonami et al. | |
| 6,841,849 B2 | 1/2005 | Miyazawa | |
| 6,852,621 B2 | 2/2005 | Hanaoka et al. | |
| 6,856,023 B2 | 2/2005 | Muta et al. | |
| 6,858,891 B2 | 2/2005 | Farnworth et al. | |
| 6,864,172 B2 | 3/2005 | Noma et al. | |
| 6,864,457 B1 | 3/2005 | Alexander et al. | |
| 6,867,390 B2 | 3/2005 | Clauer et al. | |
| 6,873,054 B2 | 3/2005 | Miyazawa et al. | |
| 6,882,030 B2 | 4/2005 | Siniaguine | |
| 6,885,107 B2 | 4/2005 | Kinsman | |
| 6,903,012 B2 | 6/2005 | Geefay et al. | |
| 6,903,442 B2 | 6/2005 | Wood et al. | |
| 6,903,443 B2 | 6/2005 | Farnworth et al. | |
| 6,910,268 B2 | 6/2005 | Miller | |

(56) References Cited

U.S. PATENT DOCUMENTS

| | | |
|---|---|---|
| 6,913,952 B2 | 7/2005 | Moxham et al. |
| 6,916,725 B2 | 7/2005 | Yamaguchi |
| 6,936,536 B2 | 8/2005 | Sinha |
| 6,939,343 B2 | 9/2005 | Sumiya |
| 6,943,056 B2 | 9/2005 | Nemoto |
| 6,946,325 B2 | 9/2005 | Yean et al. |
| 6,951,627 B2 | 10/2005 | Li et al. |
| 6,953,748 B2 | 10/2005 | Yamaguchi |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa |
| 7,033,927 B2 | 4/2006 | Cohen et al. |
| 7,037,836 B2 | 5/2006 | Lee |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,300,857 B2 | 11/2007 | Akram et al. |
| 7,317,256 B2 | 1/2008 | Williams et al. |
| 7,491,582 B2 | 2/2009 | Yokoyama et al. |
| 7,498,661 B2 | 3/2009 | Matsuo |
| 8,084,866 B2 | 12/2011 | Hiatt et al. |
| 8,748,311 B2 | 6/2014 | Hiatt et al. |
| 9,653,420 B2 | 5/2017 | Hiatt et al. |
| 2001/0020739 A1 | 9/2001 | Honda |
| 2002/0005583 A1 | 1/2002 | Harada et al. |
| 2002/0017710 A1* | 2/2002 | Kurashima ....... H01L 21/76898 257/686 |
| 2002/0020898 A1 | 2/2002 | Vu et al. |
| 2002/0027293 A1 | 3/2002 | Hoshino |
| 2002/0056925 A1 | 5/2002 | Kang et al. |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0092676 A1* | 7/2002 | Jimarez ............... H01L 21/4857 174/262 |
| 2002/0094607 A1 | 7/2002 | Gebauer et al. |
| 2002/0096729 A1 | 7/2002 | Tu et al. |
| 2002/0113312 A1 | 8/2002 | Clatanoff et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0060000 A1* | 3/2003 | Umetsu ............... H01L 21/486 438/200 |
| 2003/0119308 A1 | 6/2003 | Geefay et al. |
| 2003/0148597 A1 | 8/2003 | Tan et al. |
| 2003/0210534 A1* | 11/2003 | Swan ................ H01L 21/76898 361/807 |
| 2003/0216023 A1 | 11/2003 | Wark et al. |
| 2004/0004280 A1 | 1/2004 | Shibata |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1* | 5/2004 | Bock .................. B01J 23/462 502/313 |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0227382 A1 | 10/2005 | Hui |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0272221 A1 | 12/2005 | Yen et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0003566 A1 | 1/2006 | Emesh |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |

(56) References Cited

U.S. PATENT DOCUMENTS

| | | |
|---|---|---|
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0071347 A1 | 4/2006 | Dotta |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0195729 A1 | 8/2006 | Huppenthal et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0240687 A1 | 10/2006 | Chong et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0281224 A1 | 12/2006 | Edelstein et al. |
| 2006/0281243 A1 | 12/2006 | Trezza |
| 2006/0289967 A1 | 12/2006 | Heck et al. |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0122940 A1 | 5/2007 | Gautham |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |
| 2008/0265933 A1 | 10/2008 | Tanioka et al. |
| 2009/0007934 A1 | 1/2009 | Hutto |
| 2009/0014859 A1 | 1/2009 | Jeung et al. |
| 2009/0057912 A1 | 3/2009 | Kheng |
| 2009/0146312 A1 | 6/2009 | Sulfridge |
| 2009/0166846 A1 | 7/2009 | Pratt et al. |
| 2012/0094482 A1 | 4/2012 | Hiatt et al. |
| 2014/0284796 A1 | 9/2014 | Hiatt et al. |
| 2017/0301639 A1 | 10/2017 | Hiatt et al. |

FOREIGN PATENT DOCUMENTS

| | | |
|---|---|---|
| EP | 127946 A1 | 12/1984 |
| EP | 1154474 A1 | 11/2001 |
| EP | 1415950 A2 | 5/2004 |
| JP | 63052432 A | 3/1988 |
| JP | 01252308 A | 10/1989 |
| JP | 02235589 A | 9/1990 |
| JP | 05104316 A | 4/1993 |
| JP | 2001077496 A | 3/2001 |
| JP | 2001082931 A | 3/2001 |
| JP | 2001298147 A | 10/2001 |
| JP | 2002018585 A | 1/2002 |
| JP | 2005093980 A | 4/2005 |
| JP | 2005310817 A | 11/2005 |
| KR | 20010018694 | 3/2001 |
| KR | 20020022122 | 3/2002 |
| KR | 20020061812 | 7/2002 |
| TW | 250597 B | 7/1995 |
| WO | 2004109770 A2 | 12/2004 |
| WO | 2005022965 A2 | 3/2005 |
| WO | 2005036940 A1 | 4/2005 |
| WO | 2006053036 A2 | 5/2006 |
| WO | 2006124597 A2 | 11/2006 |
| WO | 2007025812 A1 | 3/2007 |
| WO | 2007043718 A1 | 4/2007 |

OTHER PUBLICATIONS

Aachboun, S. and P. RANSON, "Deep anisotropic etching of silicon," J. Vac. Sci. Technol. A 17(4), Jul./Aug. 1999, pp. 2270-2273.

(56) References Cited

OTHER PUBLICATIONS

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.
Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.
Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.
Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.
Blackburn, J.M. et al., "Deposition of Conformal Copper and Nickel Films from Supercritical Carbon Dioxide," Science, vol. 94, Oct. 2001, pp. 141-145.
Cheung, T.S.D. et al., "On-Chip Interconnect for mm-Wave Applications Using an All-Copper Technology and Wavelength Reduction," 2003 IEEE International Solid-State Circuits Conference.
Chou, Bill et al., "Ultra Via Substrate for Advanced BGA Applications," Pan Pacific Symposium, Jan. 25, 2000, <http://www.smta.org/files/PanPac00-ChouBill.pdf>.
De Boer, M.J. et al., "Micromachining of Buried Micro Channels in Silicon," Journal of Microelectromechanical Systems, vol. 9, No. 1, Mar. 2000, IEEE, ISSN: 1057-7157.
Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.
Hirafune, S. et al., "Packaging Technology for Imager Using Through-hole Interconnection in Si Substrate," Proceeding of HDP'04, IEEE, pp. 303-306, Jul. 2004.
Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.
Kada, M. et al., "Advancements in Stacked Chip Scale Packaging (S-CSP) Provides System-in-a-Package Functionality for Wireless and Handheld Applications," Future Fab Inti., vol. 9, Jan. 7, 2000.
Keigler, A. et al., "Enabling 3-D Design," Semiconductor International, Aug. 2007.
Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.
King, B. et al., Optomec, Inc., M3Dä Technology, Maskless Mesocaleä Materials Deposition, 5 pages, <http://www.optomec.com/downloads/M3D%20White%Paper%20080502.pdf>, retrieved from the Internet on Jun. 17, 2005.
Kuhn, Markus and Jose A. Rodriguez, "Adsorption of sulfur on bimetallic surfaces: Formation of copper sulfides on Pt(111) and Ru(001)," J. Vac. Sci. Technol. A 13(3), pp. 1569-1573, May/Jun. 1995.
Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.
Kyocera Corporation, Memory Package, 1 page, retrieved from the Internet on Dec. 3, 2004, <http://global.kyocera.com/prdct/semicon/ic_pkg/memory_p.html>.
Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.
Lee, Rex A. et al., "Laser Created Silicon Vias for Stacking Dies in MCMs," IEEE/CHMT IEMT Symposium, 1991, pp. 262-265.
Lee, T.K. et al., "A Novel Joint-in-Via Flip-Chip Chip-Scale Package," IEEE Transactions on Advanced Packaging, vol. 29, No. 1, pp. 186-194, Feb. 2006.
Morrow, P.R. et al., "Three-Dimensional Wafer Stacking Via Cu—Cu Bonding Integrated With 65-nm Strained-Si/Low-k CMOS Technology," IEEE Electron Device Letters, vol. 27, No. 5, pp. 335-337, May 2006, ISBN: 0741-3106.
Optomec, Inc., M3Dä Technology, Maskless Mesoscale Materials Deposition (M3D), 1 page, <http://www.optomec.com/html/m3d.htm>, retrieved from the Internet on Aug. 15, 2003.
Optomec, Inc., M3Dä, Maskless Mesoscaleä Materials Deposition, 2 pages, <http://www.optomec.com/downloads/M3DSheet.pdf>, retrieved from the Internet on Jun. 17, 2005.
Pienimaa, S.K. et al., "Stacked Thin Dice Package," Proceedings of the 51st Electronic Components and Technology Conference, 2001, pp. 361-366, IEEE.
Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.
Savastiouk, S. et al., "Thru-silicon interconnect technology," 26th IEEE/CPMT International Electronics Manufacturing Technology Symposium, 2000, abstract.
Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.
Solberg, V., "Innovative 3-D Solutions for Multiple Die Packaging," SMTA International Conference, Sep. 21, 2003.
Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.
Takahashi, K. et al., "Through Silicon Via and 3-D Wafer/Chip Stacking Technology," 2006 Symposium on VLSI Circuits Digest of Technical Papers.
Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.
Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.
Thomas, D.J. et al., "Etching of Vias and Trenches Through Low k Dielectrics with Feature Sizes Down to 0.1 mm Using M0RIÔ High Density Plasmas," presented at the 197th Meeting of The Electrochemical Society, Toronto 2000, <http://www.trikon.com/pdfs/ECS2b.pdf>.
Trigas, C., "System-In-Package or System-On-Chip?," EE Times, Sep. 19, 2003, <http://www.eetimes.com/story/OEG20030919S0049>.
Xsil, Via Applications, 1 page, <http://www.xsil.com/viaapplications/index.htm>, retrieved from the Internet on Jul. 22, 2003.
Xsil, Vias for 3D Packaging, 1 page, <http://www.xsil.com/viaapplications/3dpackaging/index.htm>, retrieved from the Internet on Jul. 22, 2003.
XSiL, xise200 for vias and micro-machining, <http://www.xsil.com/products/index/html>, retrieved from the Internet on Aug. 16, 2003.
Yamamoto, S. et al., "Si Through-Hole Interconnections Filled with Au—Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

* cited by examiner

MICROELECTRONIC DEVICES AND METHODS FOR FILLING VIAS IN MICROELECTRONIC DEVICES

CROSS-REFERENCE TO RELATED APPLICATIONS

This application is a continuation of U.S. patent application Ser. No. 15/583,500, filed May 1, 2017; which is a continuation of U.S. patent application Ser. No. 14/300,004, filed Jun. 9, 2014, now U.S. Pat. No. 9,653,420; which is a continuation of U.S. patent application Ser. No. 13/337,943, filed Dec. 27, 2011, now U.S. Pat. No. 8,748,311; which is a divisional of U.S. patent application Ser. No. 10/733,226, filed Dec. 10, 2003, now U.S. Pat. No. 8,084,866; each of which is incorporated herein by reference in its entirety.

This application is related to U.S. patent application Ser. No. 10/713,878 filed Nov. 13, 2003, now U.S. Pat. No. 7,091,124, entitled MICROELECTRONIC DEVICES, METHODS FOR FORMING VIAS IN MICROELECTRONIC DEVICES, AND METHODS FOR PACKAGING MICROELECTRONIC DEVICES, which is incorporated herein by reference in its entirety.

TECHNICAL FIELD

The following disclosure relates generally to microelectronic devices and, more particularly, to methods for filling vias in microelectronic workpieces.

BACKGROUND

Conventional packaged microelectronic devices can include a singulated microelectronic die, an interposer substrate or lead frame attached to the die, and a moulded casing around the die. The die generally includes an integrated circuit and a plurality of bond-pads coupled to the integrated circuit. The bond-pads are typically coupled to terminals on the interposer substrate or lead frame, and serve as external electrical contacts on the die through which supply voltage, signals, etc., are transmitted to and from the integrated circuit. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

Packaging processes for conventional microelectronic devices typically include (a) cutting the wafer to separate or singulate the dies, (b) attaching the individual dies to an interposer substrate, (c) wire-bonding the bond-pads of the dies to the terminals of the interposer substrate, and (d) encapsulating the dies with a suitable molding compound. One challenge of conventional packaging processes is that mounting the individual dies to interposer substrates or lead frames is time-consuming and expensive. Another challenge is forming wire-bonds that can withstand the forces of the molding compound during encapsulation; this issue is particularly problematic as the wire-bonds become smaller to accommodate higher pin counts and smaller packages. Yet another challenge of conventional packaging processes is that attaching individual dies to interposer substrates or lead frames may damage the bare dies. As such, processes for packaging the dies has become a significant factor in manufacturing microelectronic devices.

Another process for packaging microelectronic devices is wafer-level packaging. In this process, a plurality of microelectronic dies are formed on a wafer, and then a redistribution layer is formed over the dies. The redistribution layer can include a dielectric layer and a plurality of exposed ball-pads forming arrays on the dielectric layer. Each ball-pad array is typically arranged over a corresponding die, and the ball-pads in each array are coupled to corresponding bond-pads of the die by conductive traces extending through the dielectric layer. After forming the redistribution layer on the wafer, discrete masses of solder paste are deposited onto the individual ball-pads. The solder paste is then reflowed to form small solder balls or "solder bumps" on the ball-pads. After forming the solder balls, the wafer is singulated to separate the individual microelectronic devices from each other.

Wafer-level packaging is a promising development for increasing efficiency and reducing the cost of microelectronic devices. By "pre-packaging" individual dies with a redistribution layer before cutting the wafers to singulate the dies, sophisticated semiconductor processing techniques can be used to form smaller arrays of solder balls. Additionally, wafer-level packaging is an efficient process that simultaneously packages a plurality of dies, thereby reducing costs and increasing throughput.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of high performance devices, however, is difficult because the sophisticated integrated circuitry requires more bond-pads, which results in larger ball-grid arrays and thus larger footprints. One technique for increasing the component density of microelectronic devices within a given footprint is to stack one device on top of another.

FIG. 1 schematically illustrates a first microelectronic device 10 attached to a second microelectronic device 20 in a wire-bonded, stacked-die arrangement. The first microelectronic device 10 includes a die 12 having an integrated circuit 14 electrically coupled to a series of bond-pads 16. A redistribution layer 18 electrically couples a plurality of first solder balls 11 to corresponding bond-pads 16. The second microelectronic device 20 similarly includes a die 22 having an integrated circuit 24 electrically coupled to a series of bond-pads 26. A redistribution layer 28 electrically couples a plurality of second solder balls 21 to corresponding bond-pads 26. Wire-bonds 13 extending from the first solder balls 11 to the second solder balls 21 electrically couple the first microelectronic device 10 to the second microelectronic device 20.

The second solder balls 21 on the second microelectronic device 20 are positioned outboard of the first microelectronic device 10 to facilitate installation of the wire-bonds 13. Positioning the second solder balls 21 in this manner undesirably increases the footprint of the stacked-die arrangement. In addition, installation of the wire-bonds 13 can be a complex and/or expensive process because it requires placing individual wires between each pair of solder balls. Further, this type of installation may not be feasible for the high-density, fine-pitch arrays of some high-performance devices because the solder balls are not spaced apart far enough to be connected to individual wire-bonds.

DETAILED DESCRIPTION

A. Overview

Figure 1:
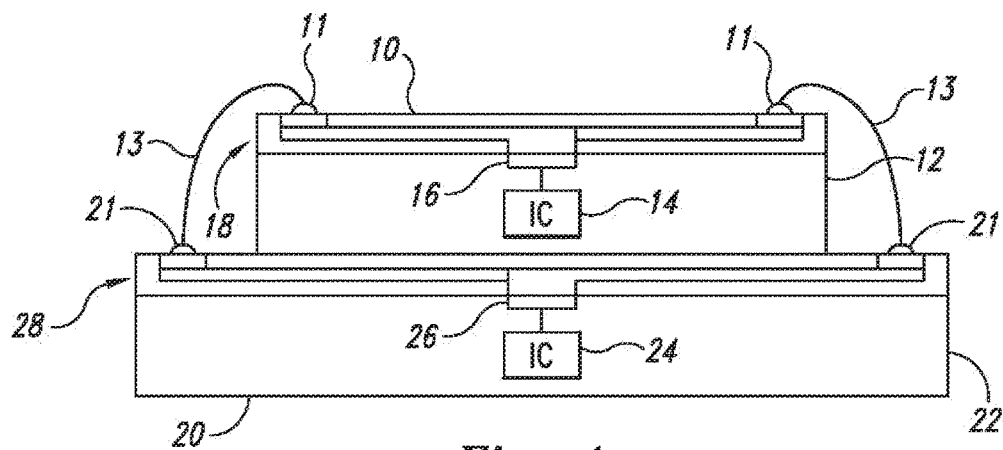
FIG. 1 schematically illustrates a first microelectronic device attached to a second microelectronic device in a stacked-die arrangement in accordance with the prior art.

The following disclosure describes several embodiments of microelectronic devices, methods for packaging microelectronic devices, and methods for filling vias in dies and other substrates to form conductive interconnects. One aspect of the invention is directed toward a method of forming a conductive interconnect in a microelectronic device. In one embodiment, the method includes providing a microfeature workpiece having a plurality of dies and at least one passage extending through the microfeature workpiece from a first side of the microfeature workpiece to an opposite second side of the microfeature workpiece. The method can further include forming a conductive plug in the passage adjacent to the first side of the microelectronic workpiece. A conductive material is then deposited in the passage to at least generally fill the passage from the conductive plug to the second side of the microelectronic workpiece.

In one aspect of this embodiment, forming a conductive plug in the passage can include depositing an electrically conductive material in the passage using a maskless mesoscale materials deposition process. In another embodiment, forming the conductive plug can include applying an electronic ink in the passage using an electronic printing process. In a further embodiment, forming the conductive plug can include depositing an electrically conductive material in the passage using a nano-particle deposition process.

A further aspect of the invention is directed toward another method of forming a conductive interconnect in a microelectronic device. In one embodiment, this method includes providing a microfeature workpiece having a plurality of dies and at least one passage extending through the microfeature workpiece from a first side of the microfeature workpiece to an opposite second side of the microfeature workpiece. The passage can define a first opening in the first side of the microfeature workpiece and a second opening in the second side of the microfeature workpiece. The method can further include applying a sealing layer to the first side of the microfeature workpiece to at least generally seal the first opening of the passage. A first portion of conductive material can then be deposited through the second opening of the passage to form a plug in the passage adjacent to the sealing layer. After the plug has been formed, a second portion of conductive material can be deposited through the second opening of the passage to at least generally fill the passage from the plug to the second side of the microelectronic workpiece.

Many specific details of the present invention are described below with reference to semiconductor devices. The term "microfeature workpiece," however, as used throughout this disclosure includes substrates upon which and/or in which microelectronic devices, micromechanical devices, data storage elements, read/write components, and other features are fabricated. For example, such microelectronic workpieces can include semiconductor wafers (e.g., silicon or gallium arsenide wafers), glass substrates, insulated substrates, and many other types of substrates. The feature signs in microfeature workpieces can include very small features of 0.11 µm or less, but larger features are also included on microfeature workpieces.

Specific details of several embodiments of the invention are described below with reference to microelectronic dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2-8.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

B. Embodiments of Microfeature Workpieces

Figure 2:
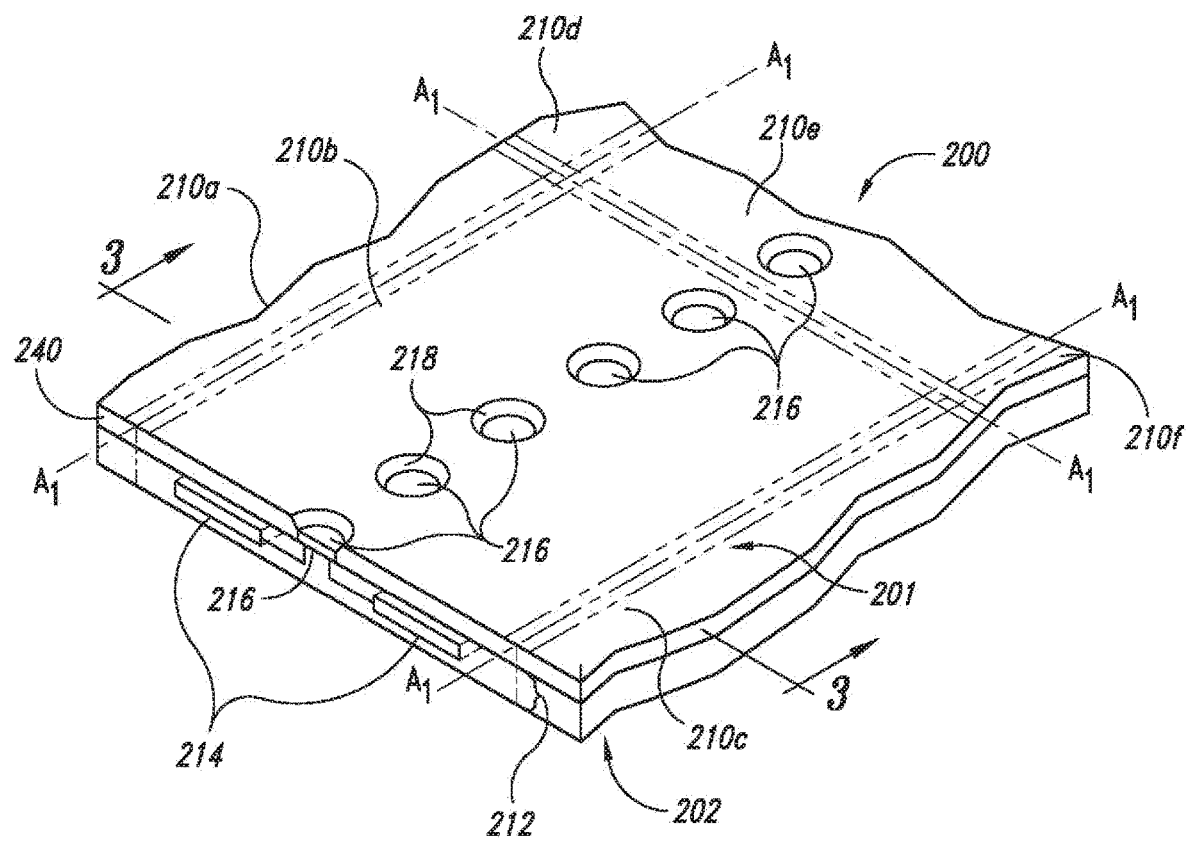
FIG. 2 is a cut-away isometric view of a microfeature workpiece configured in accordance with an embodiment of the invention.

FIG. 2 is a cut-away isometric view of a wafer or microfeature workpiece 200 configured in accordance with an embodiment of the invention. In one aspect of this embodiment, the microfeature workpiece 200 includes a front side 201, a back side 202, and a plurality of microelectronic devices 210 (identified individually as microelectronic devices 210a-f). Each microelectronic device 210 can include a microelectronic die 212 having an integrated circuit 214 (shown schematically), and a plurality of metallic and/or conductive bond-pads 216 electrically coupled to the integrated circuit 214. The microfeature workpiece 200 can further include a passivation layer 240 covering the front side 201 of the die 212 except for openings 218 at each of the bond-pads 216.

In the embodiment illustrated in FIG. 2, the processing of the microelectronic devices 210 has not been completed. As described below with reference to FIGS. 3-7B, additional processing can be carried out on the microfeature workpiece 200 to configure or package the individual microelectronic devices 210 for use in an electronic device or product. After this additional processing is complete, the microfeature workpiece 200 can be cut along lines $A_1$-$A_1$ to singulate the microelectronic devices 210.

Figure 3:
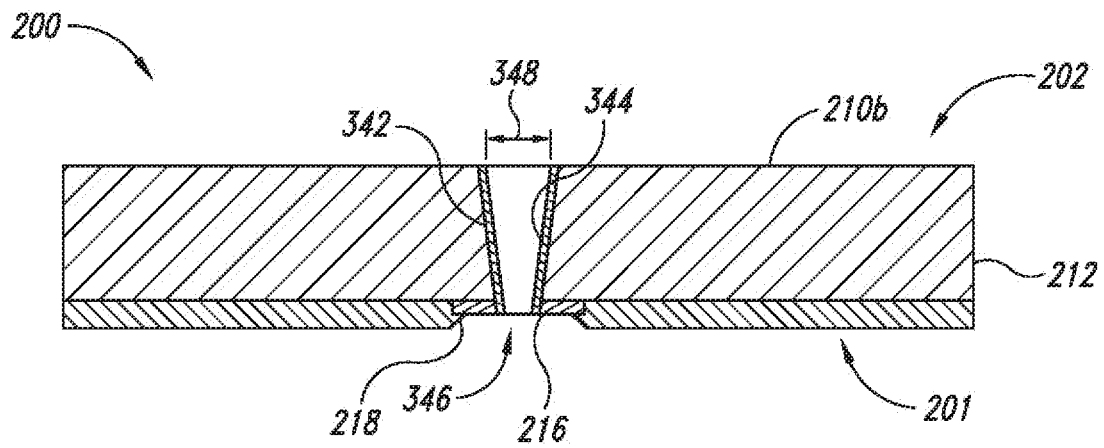
FIG. 3 is a schematic cross-sectional view of the microfeature workpiece of FIG. 2 taken substantially along line 3-3 in FIG. 2.

FIG. 3 is a schematic cross-sectional view of the microelectronic device 210b taken substantially along line 3-3 in FIG. 2 in accordance with an embodiment of the invention. The microelectronic device 210b is inverted in FIG. 3 for purposes of illustration, and it has undergone additional processing beyond that illustrated in FIG. 2. For example, in one aspect of this embodiment, the microelectronic device 210b includes a via or passage 342 extending through the die 212 and the bond-pad 216. The passage 342 and the opening 218 define a first opening 346 in the front side 201 of the microfeature workpiece 200, and a second opening 348 in the back side 202. In one embodiment, the passage 342 can be formed using a laser-cutting method at least generally similar to one or more of the methods described in U.S. patent application Ser. No. 10/713,878. In other embodiments, the passage 342 can be formed using other methods, such as a suitable etching or drilling method. Although, in one embodiment, the passage 342 may be slightly tapered as depicted in FIG. 3, in other embodiments, the passage 342 can be straight or at least approximately straight.

After the passage 342 has been formed, a dielectric layer 344 can be applied to the inner wall of the passage 342. In one embodiment, the dielectric layer 344 is an oxide applied in a low temperature chemical vapor deposition (CVD) process. In other embodiments, the dielectric layer 344 is a polyamide material or other materials suitable for insulating the die 212 from electrical leakage after the passage 342 has been filled with conductive metal (not shown) as described in greater detail below.

Figure 4:
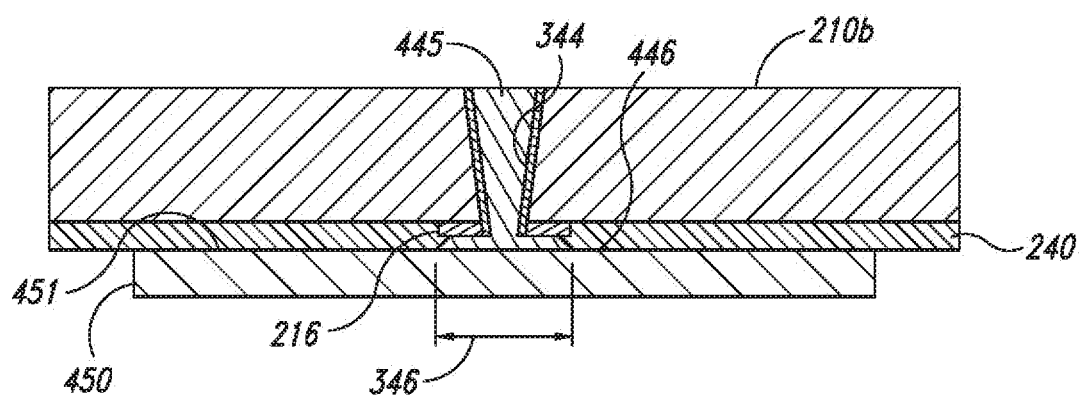
FIG. 4 is a schematic cross-sectional view illustrating a method of forming a conductive interconnect in a microelectronic device in accordance with an embodiment of the invention.

FIG. 4 is a schematic cross-sectional view illustrating a method of forming a conductive interconnect in the microelectronic device 210b of FIG. 3 in accordance with an embodiment of the invention. In one aspect of this embodiment, a conductive element 450 is positioned against the passivation layer 240 so that a contact surface 451 at least generally covers the first opening 346 of the passage 342. Once the conductive element 450 is in this position, the passage 342 can be filled with conductive material 445 to form a conductive interconnect 446 extending through the microelectronic device 210b. For example, in one embodiment, the conductive element 450 is a conductive polymer that can be biased at an electrical potential to electroplate the conductive material 445 in the passage 342. The conductive material 445 can be copper or other conductive metals, such as silver, gold, palladium, etc. In still further embodiments, other conductive materials that can be deposited at low temperatures of 250° C. or less to fill the passage 342.

One shortcoming associated with the method described above with reference to FIG. 4 is that occasionally the conductive element 450 allows some of the conductive material 445 to leak out of the first opening 346 and flow between the contact surface 451 and the passivation layer 240. This leaked material can extend between two or more bond-pads 216 (FIG. 2) and cause undesirable shorting between the bond-pads 216.

Figure 5A:
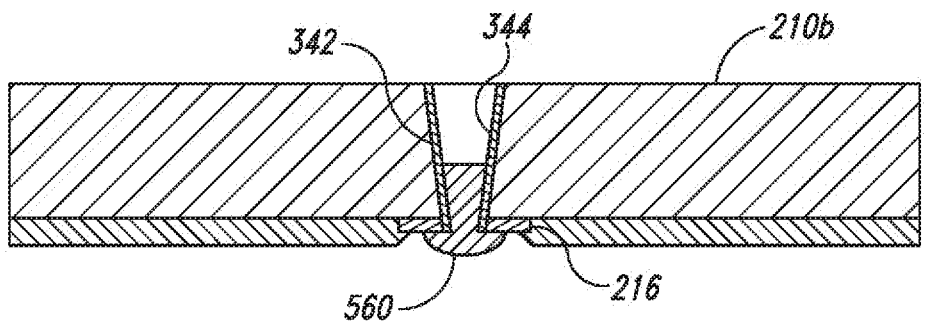
FIGS. 5A-5B are schematic cross-sectional views illustrating various stages in a method of forming a conductive interconnect in a microelectronic device in accordance with another embodiment of the invention.
Figure 5B:
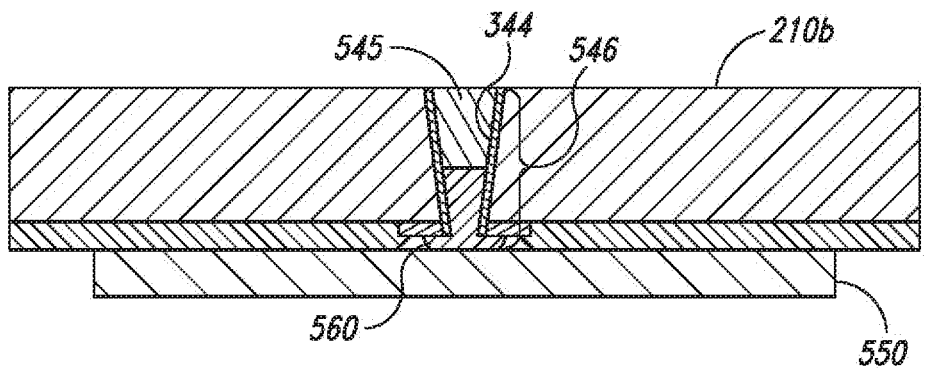

FIGS. 5A-5B are schematic cross-sectional views illustrating various stages in a method of forming a conductive interconnect in the microelectronic device 210b of FIG. 3 in accordance with another embodiment of the invention. Referring first to FIG. 5A, this method starts with the microelectronic device 210b configured as shown in FIG. 3. From there, a conductive plug 560 is formed in the passage 342 adjacent to the bond-pad 216. The conductive plug 560 can be formed with conductive material that fills a portion of the passage 342 and electrically couples to an exposed surface of the bond-pad 216 that is not insulated by the dielectric layer 344. In one embodiment, the conductive plug 560 can be formed by depositing an electrically conductive material in the passage 342 using a maskless mesoscale materials deposition process. One such process includes the $M^3D$ technology offered by Optomec, Inc., of 3911 Singer Boulevard NE, Albuquerque, N. Mex. 87109. In other embodiments, the conductive plug 560 can be formed using other suitable methods. For example, in one other embodiment, the conductive plug 560 can include an electronic ink applied to the passage 342 using an electronic printing process. In yet other embodiments, the conductive plug 560 can be formed by depositing electrically conductive material in the passage 342 using a nano-particle deposition process. In any of the foregoing embodiments, the conductive plug 560 can include silver. In other embodiments, the conductive plug 560 can include other electrically conductive materials, such as gold, copper, palladium and/or various solders. Such materials can include those that can be deposited and/or printed in a conductive ink or paste at a low temperature, such as 250° C. or less.

Referring next to FIG. 5B, after the conductive plug 560 is in place, the remaining portion of the passage 342 can be filled with a conductive material 545 to form a conductive interconnect 546 extending through the microelectronic device 210b. For example, in one embodiment the conductive plug 560 can serve as an electrode for electroplating the passage 342 with a suitable material, such as copper. In this embodiment, a conductive element 550 is positioned against the conductive plug 560 and biased at an electrical potential to electroplate the conductive material 545 within the passage 342. In other embodiments, other methods can be used to bias the conductive plug 560 at an electrical potential suitable for electroplating material into the passage 342.

Figure 6A:
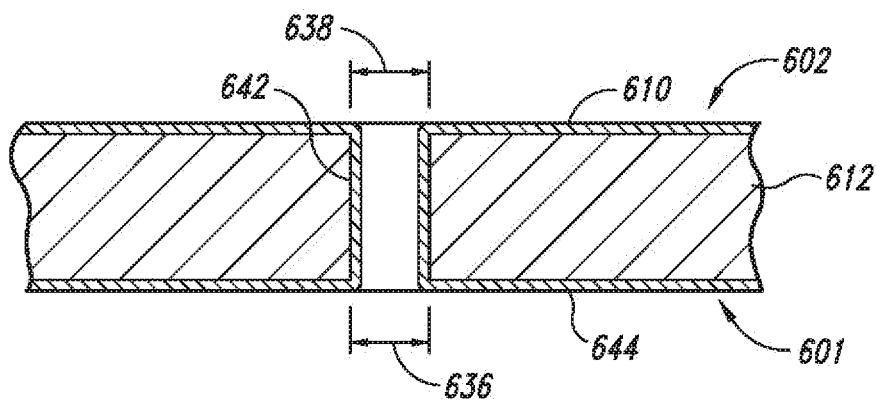
FIGS. 6A-6D are schematic cross-sectional views illustrating various stages in a method of forming a conductive interconnect in a microelectronic device in accordance with a further embodiment of the invention.

FIGS. 6A-6D are schematic cross-sectional views illustrating various stages in a method of forming a conductive interconnect in a microelectronic device 610 in accordance with an embodiment of the invention. Referring first to FIG. 6A, the microelectronic device 610 can include a die 612 having a through-hole or passage 642. The passage 642 defines a first opening 636 in a first side 601 of the microelectronic device 610 and a second opening 638 in a second side 602. A passivation layer 644 covers the die 612 including the inner wall of the passage 642. In one embodiment, the passivation layer 644 can be tetraethylorthosilicate (TEOS) deposited using a low temperature CVD process. In other embodiments, the passivation layer 644 can be parylene and/or other suitable materials, such as silicon dioxide ($SiO_2$) or silicon nitrite ($Si_3N_4$). The foregoing list of passivation and/or dielectric material options is not exhaustive. Accordingly, in other embodiments, it is expected that other suitable materials and processes can be used to form one or more of the passivation and/or dielectric layers discussed herein.

Figure 6B:
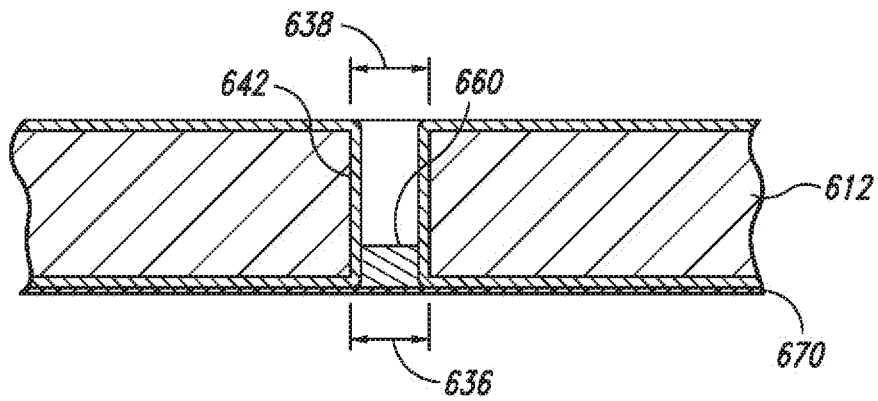

Referring next to FIG. 6B, a tape, film, or other type of suitable sealing layer 670 can be temporarily applied to the die 612 to at least generally seal the first opening 636 of the passage 642. After the first opening 636 has been sealed, a first portion of conductive material is deposited through the second opening 638 to form a plug 660 in the passage 642 adjacent to the sealing layer 670. In one embodiment, forming the plug 660 can include depositing an electrically conductive material in the passage using a maskless mesoscale materials deposition process as described above with reference to FIG. 5A. In another embodiment, forming the plug 660 can include applying an electronic ink in the passage 642 using an electronic printing process. In yet another embodiment, forming the plug 660 can include depositing an electrically conductive material in the passage 642 using a nano-particle deposition process to deposit silver or other suitable metal.

Figure 6C:
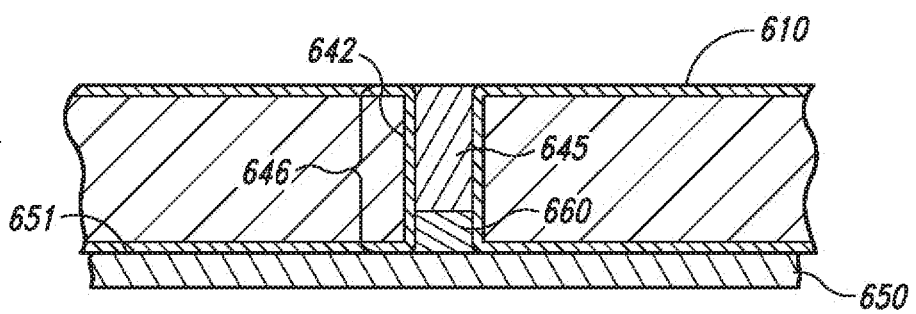

As shown in FIG. 6C, the sealing layer 670 (FIG. 6B) is removed from the microelectronic device 610, and a conductive element 650 is positioned against the microelectronic device 610 so that a contact surface 651 makes electrical contact with the plug 660. As described above with reference to the embodiments shown in FIGS. 4 and 5B, the conductive element 650 can include an electrode configured to bias the plug 660 at an electrical potential for electroplating the passage 642 with a second portion of conductive material 645 to form a conductive interconnect 646 extending through the microelectronic device 610.

Figure 6D:
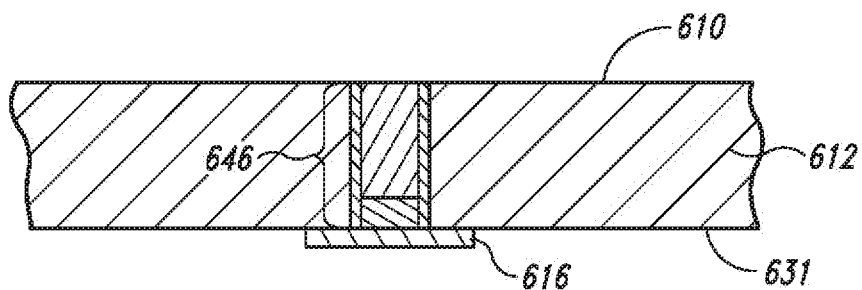

Referring to FIG. 6D, after the conductive interconnect 646 has been formed, additional processing steps can be carried out to package the microelectronic device 610 for use in a microelectronic device set. Such a microelectronic set can include a set having a stacked-die arrangement. In one embodiment, such processing steps can include removing the passivation layer 644 (FIG. 6A) from a first surface 631 of the die 612, and forming a bond-pad 616 on the die 612 electrically coupled to the conductive interconnect 646. In other embodiments, other processing steps can be employed to configure the microelectronic device 610 in a suitable form for subsequent use in a microelectronic device set or product.

Figure 7A:
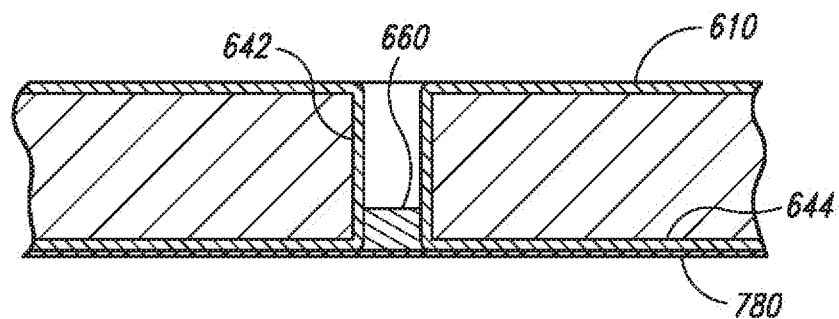
FIGS. 7A-7B are schematic cross-sectional views illustrating various stages in a method of forming a conductive interconnect in a microelectronic device in accordance with yet another embodiment of the invention.
Figure 7B:
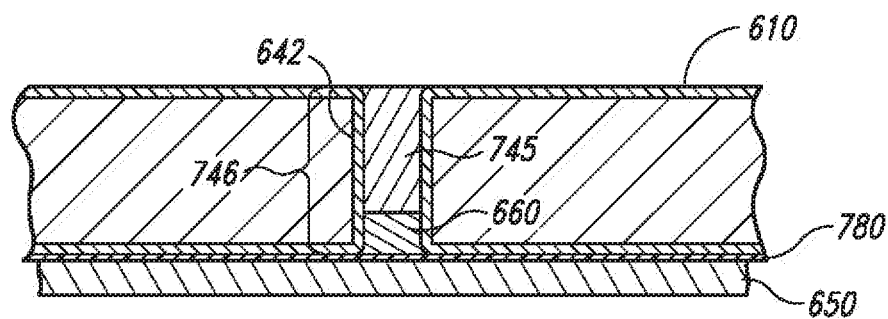

FIGS. 7A-7B are schematic cross-sectional views illustrating various stages in a method of forming a conductive interconnect in the microelectronic device 610 in accordance with an embodiment of the invention that is similar to the embodiment described above with reference to FIGS. 6A-6D. In one aspect of this embodiment as shown in FIG. 7A, after the plug 660 is formed in the passage 642, the sealing layer 670 (FIG. 6B) is removed and a metallic layer 780 is deposited on the passivation layer 644 in electrical contact with the plug 660. In one embodiment, the metallic layer 780 can be a metal layer formed by physical vapor deposition (PVD). In other embodiments, the metallic layer 780 can include other materials formed by other processes, such as a suitable CVD process.

Referring next to FIG. 7B, after the metallic layer 780 has been deposited on the microelectronic device 610, the conductive element 650 is positioned against the metallic layer 780. As discussed above, the conductive element 650 can be a plate electrode or a conductive polymer configured to apply an electrical bias to the metallic layer 780, which in turn biases the plug 660. The conductive element 650, however, can be a finger type contact as shown in U.S. Pat. No. 6,080,291, which is herein incorporated by reference. Electrically biasing the plug 660 facilitates electroplating a second portion of conductive material 745 in the passage 642 adjacent to the plug 660. Together, the plug 660 and the second portion of conductive material 745 form a conductive interconnect 746 extending through the microelectronic device 610.

Figure 7C:
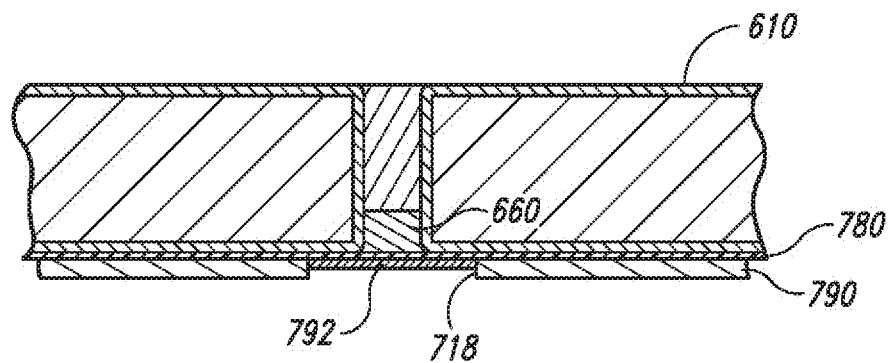
FIGS. 7C-7D are schematic cross-sectional views illustrating various stages in a method of forming a bond-pad electrically coupled to the conductive interconnect of FIG. 7B.
Figure 7D:
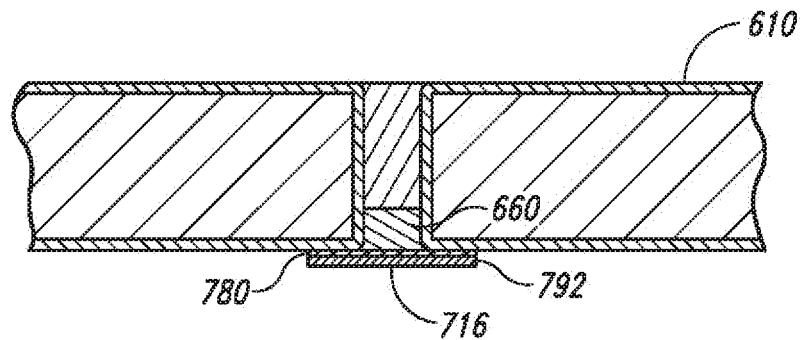

FIGS. 7C-7D are schematic cross-sectional views illustrating various stages in a method of forming a bond-pad electrically coupled to the plug 660 in accordance with an embodiment of the invention. In one aspect of this embodiment as shown in FIG. 7C, a resist layer 790 is formed on the metallic layer 780, and an opening 718 is formed in the resist layer 790 adjacent to the plug 660. A metallic portion 792 is then deposited on the metallic layer 780 through the opening 718 by using the metallic layer 780 as a seed layer. After depositing the metallic portion 792, the resist layer 790 is removed as shown in FIG. 7D. In addition, all of the metallic layer 780, except for the portion under the metallic portion 792, is also removed (for example, by a suitable etching process). Together, the remaining metallic layer 780 and metallic portion 792 form a bond-pad 716 electrically coupled to the plug 660. Although the foregoing discussion describes one method for forming a bond-pad on the microelectronic device 610, in other embodiments, other methods can be used to form bond-pads electrically coupled to the plug 660.

Figure 8:
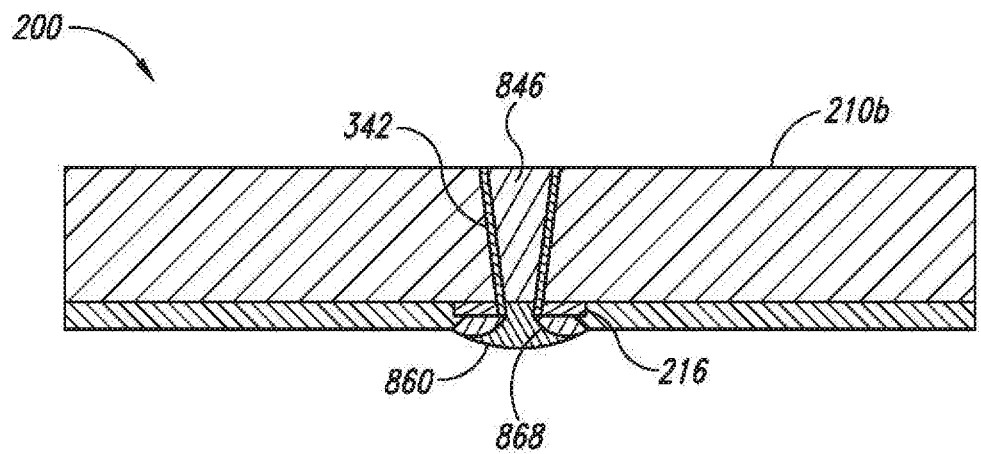
FIG. 8 is a schematic cross-sectional view illustrating a method of forming a conductive interconnect in a microelectronic device using solder tent technology in accordance with a further embodiment of the invention.

FIG. 8 is a schematic cross-sectional view illustrating a method of forming a conductive interconnect in the microelectronic device 210b of FIG. 3 using solder tent technology in accordance with a further embodiment of the invention. This method starts with the microelectronic device 210b configured as shown in FIG. 3. From there, a metallic material 868 is applied to the bond pad 216 by plating or another suitable process. In one aspect of this embodiment, the bond pad 216 can be Aluminum (Al) and the metallic material 868 can be Nickel (Ni) that acts as a wetting agent to help subsequent material applications adhere to the bond pad 216. After the metallic material 868 has been applied, a conductive plug 860 is formed to fill a portion of the passage 342 and electrically couple to the bond-pad 216. In one embodiment, the conductive plug 860 can be formed by depositing an electrically conductive material in the passage 342 using solder tent technology. In this embodiment, the conductive plug can include Tin-Lead (SnPb), Tin-Silver-Copper (SnAgCu), Tin-Cu (SnCu), or Tin-Silver (SnAg) material, among others. After the conductive plug 860 is in place, the remaining portion of the passage 342 can be filled with a conductive material using one or more of the methods described above (such as the method described above with reference to FIG. 5B) to form a conductive interconnect 846 extending through the microelectronic device 210b.

Figure 9:
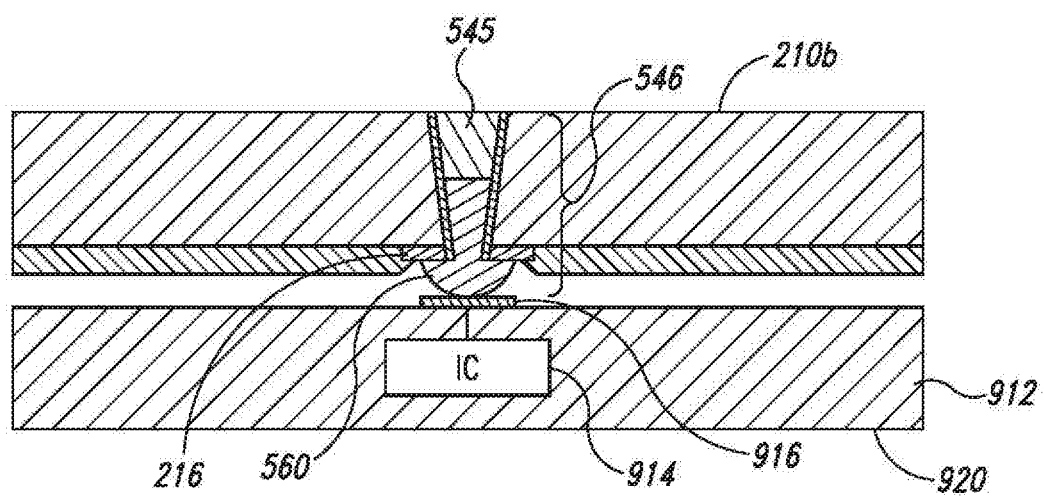
FIG. 9 is a schematic cross-sectional view illustrating a microelectronic device set configured in accordance with an embodiment of the disclosure.

FIG. 9 schematically illustrates a microelectronic device set comprised of the first microelectronic device 210b and a second microelectronic device 920. In the illustrated embodiment, the second microelectronic device 920 includes a second die 912 with a second integrated circuit 914 electrically coupled to a second bond-pad 916. The second bond pad 916 can be electrically coupled to the conductive interconnect 546 and the first bond pad 216 by, for example, re-melting or reflowing a portion of the conductive plug 560 and/or using other suitable connection methods known in the art.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of forming a conductive interconnect in a microelectronic device, the method comprising:
providing a die having a first side and a second side opposite to the first side, the die further having a bond-pad positioned on the first side;
forming a passage completely through the die and the bond-pad, wherein the passage defines an opening at the second side of the die;
depositing an insulative layer in the passage;
depositing a first conductive material in a first portion of the passage and at least partially on the bond-pad to form a conductive plug electrically connected to the bond-pad, wherein the depositing of the first conductive material includes depositing the first conductive material such that the first conductive material has a surface farthest from the first side, wherein the surface is positioned within the passage between the first and second sides, and wherein the first conductive material directly contacts the insulative layer between the first side of the die and the second side of the die; and
after depositing the first conductive material in the first portion of the passage and at least partially on the bond-pad, depositing a second conductive material (a) through the opening in the passage at the second side of the die in a direction toward the surface of the first conductive material and the first side of the die and (b) in a second portion of the passage in contact with the surface of the first conductive material to at least generally fill the passage from the surface of the first conductive material to the second side of the die, wherein the second conductive material directly contacts the insulative layer between the first side of the die and the second side of the die.

2. The method of claim 1 wherein depositing the first conductive material includes depositing the first conductive material such that the insulative layer is between the die and the first conductive material, and wherein depositing the second conductive material includes depositing the second conductive material such that the insulative layer is between the die and the second conductive material.

3. The method of claim 1 wherein depositing the first conductive material includes depositing an electronic ink.

4. The method of claim 1 wherein depositing the first conductive material includes a nano-particle deposition.

5. The method of claim 1 wherein depositing the second conductive material in the second portion of the passage includes biasing the conductive plug at an electrical potential.

6. The method of claim 1 wherein depositing the second conductive material includes electroplating the second conductive material onto the first conductive material.

7. The method of claim 1 wherein depositing the first conductive material includes depositing the first conductive material via a first deposition process, and wherein depositing the second conductive material includes depositing the second conductive material via a second deposition process different than the first deposition process.

8. The method of claim 7 wherein the second deposition process is an electroplating process.

9. A method of forming a conductive interconnect in a microfeature workpiece, the microfeature workpiece having a first side, a second side opposite to the first side, a bond-pad formed on the first side, and a die, the method comprising:

forming a passage completely through the bond-pad and the die from the first side of the microfeature workpiece to the second side of the microfeature workpiece;
depositing an insulative layer in the passage;
depositing a first conductive material in a first portion of the passage adjacent to the first side of the microfeature workpiece in direct physical contact with the bond-pad to form a conductive plug, wherein the depositing of the first conductive material includes depositing the first conductive material such that the first conductive material has a surface farthest from the first side, wherein the surface is positioned within the passage such that the first conductive material extends through the passage from the first side only partially toward the second side, wherein the first conductive material directly contacts the insulative layer between the first side of the microfeature workpiece and the second side of the microfeature workpiece; and
after depositing the first conductive material in the first portion of the passage and in direct physical contact with the bond-pad, depositing a second conductive material in a second portion of the passage in contact with surface of the first conductive material to at least generally fill the passage from surface of the first conductive material to the second side of the microfeature workpiece, wherein the second conductive material directly contacts the insulative layer between the first side of the microfeature workpiece and the second side of the microfeature workpiece, and wherein the second conductive material is different than the first conductive material.

10. The method of claim 9 wherein depositing the first conductive material includes depositing an electronic ink.

11. The method of claim 9 wherein depositing the first conductive material includes a nano-particle deposition.

12. The method of claim 9 wherein depositing the first conductive material includes depositing the first conductive material such that the first insulative layer is between the die and the first conductive material, and wherein depositing the second conductive material includes depositing the second conductive material such that the insulative layer is between the die and the second conductive material.

13. The method of claim 9, further comprising forming a metallic layer on the first side of the microfeature workpiece.

14. The method of claim 9, further comprising forming the bond-pad on the die.

15. A method of forming a microelectronic device set having a first microelectronic device and a second microelectronic device, the first microelectronic device having a first die with a first integrated circuit and a first bond-pad electrically coupled to the first integrated circuit, the second microelectronic device having a second die with a second integrated circuit and a second bond-pad electrically coupled to the second integrated circuit, the method comprising:
forming a passage completely through the first die and the first bond-pad;
depositing a first conductive material in a first portion of the passage in direct physical contact with the first bond-pad to form a conductive plug electrically connected to the bond pad, wherein the depositing of the first conductive material includes depositing the first conductive material such that the first conductive material has a surface farthest from the first bond-pad, wherein the surface is positioned within the passage such that the first conductive material extends only partially through the passage, wherein the conductive plug is in direct contact with an inner wall of the passage;

after depositing the first conductive material in the first portion of the passage and in direct physical contact with the first bond-pad, depositing a second conductive material in a second portion of the passage in direct contact with the inner wall of the passage and the surface of the first conductive material to at least generally fill the passage, wherein the first conductive material and the second conductive material together define a conductive interconnect; and electrically coupling the conductive interconnect to the second bond-pad of the second microelectronic device.

16. The method of claim 15 wherein forming the passage completely through the first die and the first bond-pad includes forming a passage having an insulative layer that defines the inner wall of the passage, wherein the insulative layer is deposited between the first die and the first conductive material and between the first die and the second conductive material.

17. The method of claim 15 wherein depositing the second conductive material in a second portion of the passage includes biasing the conductive plug at an electrical potential.

18. The method of claim 15 wherein electrically coupling the conductive interconnect of the first microelectronic device to the second bond-pad of the second microelectronic device includes attaching the first microelectronic device to the second microelectronic device in a stacked-die arrangement.

19. The method of claim 15 wherein electrically coupling the conductive interconnect of the first microelectronic device to the second bond-pad of the second microelectronic device includes depositing a solder ball between the conductive interconnect and the second bond-pad.

20. The method of claim 15 wherein the passage is a first passage, and wherein the method further comprises:

forming a second passage through the second die and the second bond-pad; and filling the second passage with a third conductive material.

21. The method of claim 15, further comprising forming a redistribution layer on the first die, the redistribution layer including a conductive line having a first end portion attached to the first bond-pad and a second end portion positioned outward of the first end portion, wherein the second end portion is configured to receive electrical signals and transmit the signals to at least the first integrated circuit of the first die and the second integrated circuit of the second die.

* * * * *